(12) United States Patent
Kawate et al.

(10) Patent No.: US 7,592,819 B2
(45) Date of Patent: Sep. 22, 2009

(54) MICROPROCESSOR-BASED CAPACITANCE MEASUREMENT

(75) Inventors: Keith W. Kawate, Attleboro Falls, MA (US); John A. Powning, Providence, RI (US); Mark Genovese, Taunton, MA (US); Eric M. Visser, Enschede (NL)

(73) Assignee: Sensata Technologies, Inc., Attleboro, MA (US)

( * ) Notice: Subject to any disclaimer, the term of this patent is extended or adjusted under 35 U.S.C. 154(b) by 258 days.

(21) Appl. No.: 11/678,158

(22) Filed: Feb. 23, 2007

(65) Prior Publication Data

US 2008/0204049 A1 Aug. 28, 2008

(51) Int. Cl.
*G01R 27/26* (2006.01)
(52) U.S. Cl. ...................... 324/679; 324/686
(58) Field of Classification Search .............. 324/679, 324/686; 702/104

See application file for complete search history.

(56) References Cited

U.S. PATENT DOCUMENTS

| 4,227,419 A | 10/1980 | Park |
| 4,398,426 A | 8/1983 | Park et al. |
| 4,860,232 A * | 8/1989 | Lee et al. .................... 702/104 |
| 4,951,236 A | 8/1990 | Kawate et al. |
| 5,770,802 A | 6/1998 | Berthold et al. |

* cited by examiner

*Primary Examiner*—Vincent Q Nguyen
(74) *Attorney, Agent, or Firm*—Russell E. Baumann

(57) ABSTRACT

An improved system and method of performing capacitance measurements that provides a fast digital response and a reduced output error. The capacitance measurement system includes a circuit configuration that has a variable capacitor and at least one reference capacitor connected to one another at a common node, which in turn is connected to the input of an analog-to-digital converter. The circuit configuration further includes an array of switches coupled between the variable and reference capacitors and the supply voltage, a reference voltage, and ground, respectively. The switched variable and reference capacitors are employed in conjunction with the A-to-D converter to perform, at the common node, a plurality of direct voltage measurements for use in generating an expression defining the capacitance of the variable capacitor.

20 Claims, 5 Drawing Sheets

MICROPROCESSOR-BASED CAPACITANCE MEASUREMENT

CROSS REFERENCE TO RELATED APPLICATIONS

Not applicable

STATEMENT REGARDING FEDERALLY SPONSORED RESEARCH OR DEVELOPMENT

Not applicable

BACKGROUND OF THE INVENTION

The present invention relates generally to capacitive measurement systems and methods, and more specifically to systems and methods of performing capacitance measurements with increased speed and reduced output error.

Capacitive measurement systems and methods are known that employ a variable capacitor having a capacitance that varies in response to an applied stimulus such as pressure or acceleration. For example, U.S. Pat. No. 5,770,802 issued Jun. 23, 1998 and entitled SENSOR WITH IMPROVED CAPACITIVE TO VOLTAGE CONVERTER INTEGRATED CIRCUIT (the "'802 patent") discloses a conventional capacitive measurement system that includes a variable capacitor connected to a reference capacitor at a common node, which in turn is connected to a charge comparator. As disclosed in the '802 patent, the output of the charge comparator is connected to a voltage-to-current stage, which has an output connected, through a phase C switch to the positive input of an integrator buffer and to an integrating capacitor. The output of the integrator buffer is connected to an output amplifier, an analog feedback network, and, via at least one first phase B switch, to the variable capacitor. At the start of an instruction cycle, a phase A switch connected across the charge comparator is "opened". Next, a plurality of second phase B switches connecting the reference capacitor and the variable capacitor to a gain voltage and a bias voltage, respectively, are opened. A plurality of third phase B switches connecting the reference capacitor and the variable capacitor to the supply voltage and the analog feedback network, respectively, are then "closed", thereby switching the voltages across the reference capacitor and the variable capacitor, and inducing a net charge at their common node. At a steady state condition, any net charge at this common node represents an error charge, which is first converted to a voltage by the charge comparator, and then converted to a current by the voltage-to-current stage. After a settling time, the phase C switch connected to the output of the voltage-to-current stage is closed to convert the current, via the integrating capacitor, back to a voltage at the output of the integrator buffer. This voltage, which has a polarity opposite to that of the net error charge on the common node, is fed back to the variable capacitor to null out the error charge. Finally, the phase C switch is opened, while the other phase switches return to their previous states, to prepare for the next instruction cycle.

Although the conventional capacitive measurement system disclosed in the '802 patent has been successfully employed in numerous applications that require a measure of an applied stimulus such as pressure or acceleration, it has several drawbacks. For example, the capacitive measurement system of the '802 patent has a response time that is often too slow for applications requiring fast conversion times, e.g., less than 2 milliseconds. In addition, this capacitive measurement system is generally inappropriate for use in applications that require a fast digital response.

It would therefore be desirable to have an improved system and method of performing capacitance measurements that avoids the drawbacks of the above-described conventional capacitive measurement system.

BRIEF SUMMARY OF THE INVENTION

In accordance with the present invention, an improved system and method of performing capacitance measurements is disclosed that provides a fast digital response and a reduced output error. The presently disclosed capacitance measurement system and method achieves such fast digital response and reduced output error via a circuit configuration that includes a variable capacitor and at least one reference capacitor connected to one another at a common node, which in turn is connected to the input of an analog-to-digital (A-to-D) converter. In one embodiment, the common node of the variable and reference capacitors is directly connected to the input of the A-to-D converter. The circuit configuration further includes an array of switches coupled between the variable and reference capacitors and the supply voltage, a reference voltage, and ground, respectively. The switched variable and reference capacitors are employed in conjunction with the A-to-D converter to perform, at the common node, a plurality of voltage measurements which are subsequently used to generate an expression defining the capacitance of the variable capacitor. The generated expression of variable capacitance is independent of a number of output error sources including but not limited to a sample-and-hold capacitance, the parasitic capacitance at the input of the A-to-D converter, a sample-and-hold offset voltage, and the leakage current at the input of the A-to-D converter.

In one embodiment, the capacitance measurement system includes a variable capacitor (Cx) and two reference capacitors (Cr, Co) connected to one another at a common node, which in turn is connected to the input of the A-to-D converter. The capacitance measurement system further includes an array of switches coupled between the variable and reference capacitors (Cx, Cr, Co), and the supply voltage (Vcc) and ground, respectively. The switched variable and reference capacitors are employed in conjunction with the A-to-D converter to perform, at the common node, two voltage measurements (f1, f2) for use in generating an expression defining the capacitance of the variable capacitor (Cx), specifically, $$(Cx-Cr)/Co \cong (f1-f2)/(f1+f2),$$

in which "f1" and "f2" are two digital conversions generated by the A-to-D converter. For example, f1 and f2 can range from 0 to $2^N-1$, in which "N" is equal to the number of A-to-D converter bits. In this embodiment, the generated expression of variable capacitance is substantially independent of measurement error resulting from the sample-and-hold capacitance (Csh), and the parasitic capacitance (Op) at the input of the A-to-D converter.

In another embodiment, the capacitance measurement system again includes the variable capacitor (Cx) and the two reference capacitors (Cr, Co) connected to one another at the common node, which is connected to the A-to-D converter input, and the array of switches coupled between the variable and reference capacitors (Cx, Cr, Co), and the supply voltage (Vcc), a reference voltage (Vref), and ground, respectively. In this second embodiment, the switched variable and reference capacitors are employed in conjunction with the A-to-D converter to perform, at the common node, three voltage measurements (f1, f2, f3) for use in generating an expression defining the capacitance of the variable capacitor (Cx), specifically, $$(Cx-Cr)/Co \cong (f1-f2)/(f2+(2^N-1)-f3),$$

in which "N" is equal to the number of A-to-D converter bits. For example, for a 10-bit A-to-D converter, $2^N-1$ is equal to 1023. In this second embodiment, the generated expression of variable capacitance is substantially independent of measurement error resulting from the sample-and-hold capacitance (Csh), the parasitic capacitance (Cp) at the input of the A-to-D converter, the sample-and-hold offset voltage (Vos), and the leakage current (Io) at the input of the A-to-D converter.

In still another embodiment, the capacitance measurement system includes the variable capacitor (Cx) and a single reference capacitor (Cr) connected to one another at a common node, which in turn is connected to the A-to-D converter input, and an array of switches coupled between the variable and reference capacitors (Cx, Cr) and the supply voltage (Vcc), a reference voltage (Vref), and ground, respectively. The switched variable and reference capacitors are employed in conjunction with the A-to-D converter to perform, at the common node, four voltage measurements (f1, f2, f3, f4) for use in generating an expression defining the capacitance of the variable capacitor (Cx), specifically, $$(Cx-Cr)/Cr \cong ((2^N-1)+f1-f3)/((2^N-1)+f2-f4),$$

in which "N" is equal to the number of A-to-D converter bits. In this third embodiment, the generated expression of variable capacitance is substantially independent of measurement error resulting from the sample-and-hold capacitance (Csh), the parasitic capacitance (Cp) at the input of the A-to-D converter, the sample-and-hold offset voltage (Vos), and the leakage current (Io) at the input of the A-to-D converter.

In yet another embodiment, the capacitance measurement system again includes the variable capacitor (Cx) and the single reference capacitor (Cr) connected to one another at the common node, which is connected to the A-to-D converter input, and the array of switches coupled between the variable and reference capacitors (Cx, Cr) and the supply voltage (Vcc), a reference voltage (Vref), and ground, respectively. In this fourth embodiment, the switched variable and reference capacitors are employed in conjunction with the A-to-D converter to perform, at the common node, three voltage measurements (f1, f2, f3) for use in generating an expression defining the capacitance of the variable capacitor (Cx), specifically, $$Cr/Cx \cong ((2^N-1)+f2-f3)/((2^N-1)+2*f1-f2-f3),$$

in which "f1", "f2", and "f3" are digital conversions generated by the A-to-D converter. In this fourth embodiment, the generated expression of variable capacitance is substantially independent of measurement error resulting from the sample-and-hold capacitance (Csh), the parasitic capacitance (Cp) at the input of the A-to-D converter, the sample-and-hold offset voltage (Vos), and the leakage current (Io) at the input of the A-to-D converter.

In each embodiment of the presently disclosed capacitance measurement system, a representation of the expression of variable capacitance may be generated using a microprocessor or microcontroller, which may be implemented as an integrated circuit including the A-to-D converter, in an alternative embodiment, the A-to-D converter may be implemented separately from the microprocessor or microcontroller.

By providing a capacitance measurement system that includes a circuit configuration having switched variable and reference capacitors connected to one another at a common node, which in turn is connected to the input of an A-to-D converter; a plurality of voltage measurements may be performed at the common node for use in generating an expression that defines the capacitance of the variable capacitor. Based at least in part upon the number of reference capacitors employed in the system and the number of voltage measurements performed at the common node, the generated expression of variable capacitance can be made to be substantially independent of multiple output error sources.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which:

FIG. 1b is a block diagram of a microprocessor-based implementation of the capacitance measurement system of FIG. 1a;

FIG. 2a is a schematic diagram of an alternative embodiment of the capacitance measurement system of FIG. 1a;

FIG. 2b is a block diagram of a microprocessor-based implementation of the capacitance measurement system of FIG. 2a, and FIG. 3 is a schematic diagram of an alternative embodiment of the capacitance measurement system of FIG. 2a.

DETAILED DESCRIPTION OF THE INVENTION

An improved system and method of performing capacitance measurements is disclosed that provides a fast digital response and a reduced output error. The presently disclosed capacitance measurement system and method achieves such fast digital response and reduced output error via a circuit configuration that includes a switched variable capacitor and at least one switched reference capacitor connected to one another at a common node, which in tunic is connected to the input of an analog-to-digital (A-to-D) converter. A plurality of voltage measurements is performed at the common node of the switched variable and reference capacitors for use in generating an expression of variable capacitance that is substantially independent of multiple output error sources.

Figure 1A:
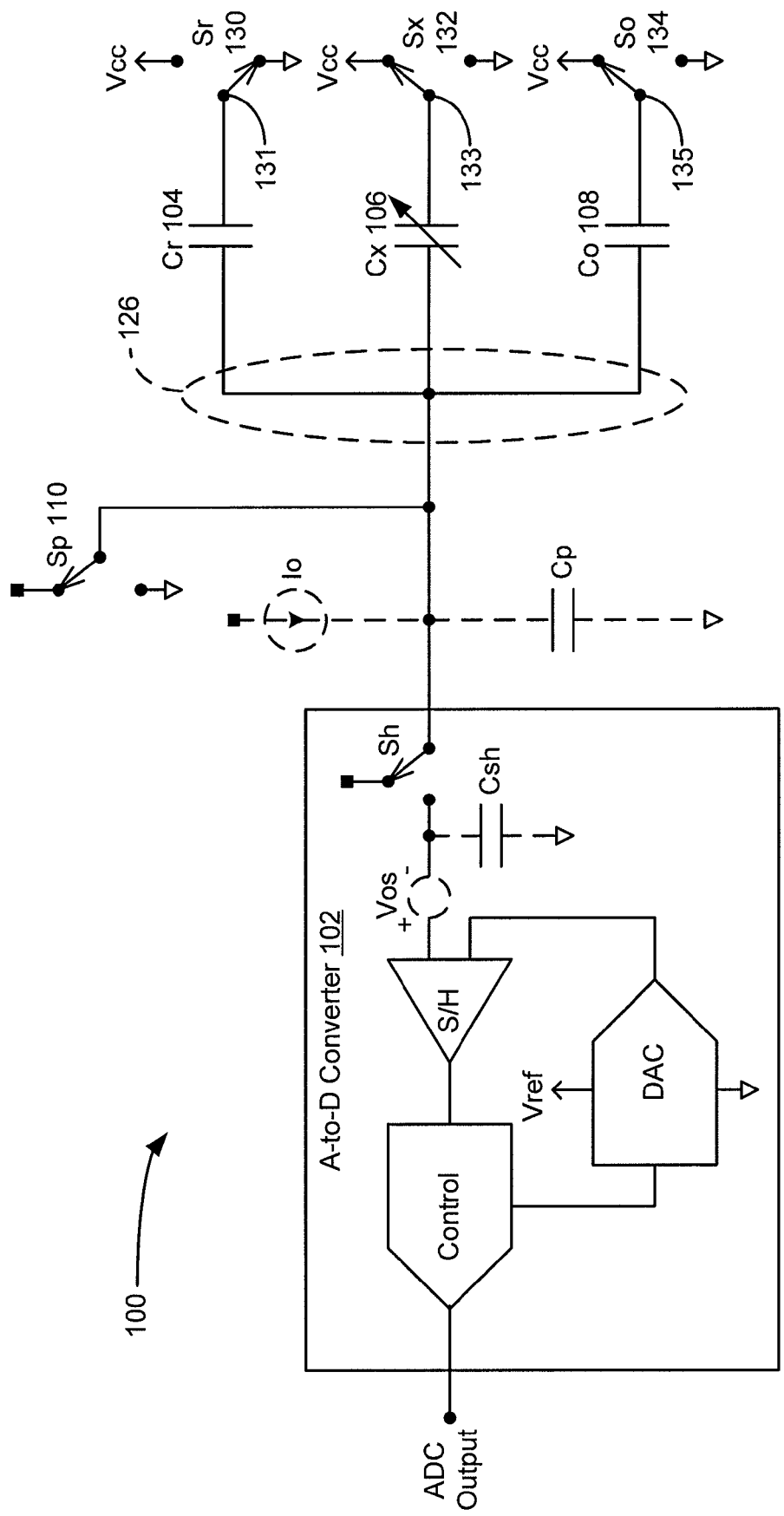
FIG. 1a is a schematic diagram of a capacitance measurement system according to the present invention.

FIG. 1a depicts an illustrative embodiment of a capacitance measurement system 100, in accordance with the present invention. In the illustrated embodiment, the capacitance measurement system 100 includes a variable capacitor Cx 106, a first reference capacitor Cr 104, a second reference capacitor Co 108, and an analog-to-digital (A-to-D) converter sub-system 102 which includes an A-to-D converter control component (Control), a digital-to-analog converter (DAC), and a sample-and-hold comparator (S/H) having a sample-and-hold switch (Sh). The capacitance measurement system 100 further includes an array of switches Sr 130, Sx 132, So 134, and Sp 110. Specifically, the variable capacitor Cx 106, the reference capacitor Cr 104, and the reference capacitor Co 108 are connected to one another to form a common node 126, which in turn is connected to the sample-and-hold comparator (S/H) via the sample-and-hold switch (Sh). The switch Sx 132 is a single pole/double throw (SPDT) switch operative to switchingly connect a terminal 133 of the variable capacitor Cx 106 to the supply voltage Vcc and ground. Similarly, the switch Sr 130 is a SPDT switch operative to switchingly connect a terminal 131 of the reference capacitor Cr 104 to the supply voltage Vcc and ground, and the switch So 134 is a SPDT switch operative to switchingly connect a terminal 135 of the reference capacitor Co 108 to the supply voltage Vcc and ground. The switch Sp 110 is a two-position switch operative to switch between an "open" position and a "closed" position, which connects the common node 126 to ground. The S/H switch (Sh) included in the A-to-D converter 102 is also a two-position switch operative to switch between an open position and a closed position, thereby coupling the common node 126 to the sample-and-hold circuit (S/H) within the A-to-D converter 102.

It is noted that the variable capacitor Cx 106 may be configured so that its capacitance varies in response to an applied stimulus such as pressure or acceleration. Alternatively, the variable capacitor Cx 106 may be implemented as, e.g., a polymer capacitor on glass, to provide an element for sensing relative humidity. It should be appreciated, however, that any other suitable configuration of the variable capacitor Cx may be employed. It is further noted that the structure and operation of the A-to-D converter sub-system 102 is conventional, and therefore a detailed description of such structure and operation of the A-to-D converter 102 is omitted for clarity of discussion. For example, the A-to-D converter sub-system 102 may be implemented as a 10-bit successive approximation ADC, or any other suitable type of ADC.

Accordingly, the A-to-D converter 102 is operative to provide an ADC output, which is a multi-bit digital representation of the voltage at the common node 126 of the variable and reference capacitors 104, 106, 108. As shown in FIG. 1a, the digital voltage representation at the ADC output may have multiple sources of error, including but not limited to a sample-and-hold capacitance (Csh), a parasitic capacitance (Cp) at the input of the A-to-D converter 102 including the trace capacitance of the common node 126, a sample-and-hold offset voltage (Vos), and a leakage current (Io) at the A-to-D converter input.

In one mode of operation, the switched variable and reference capacitors 104, 106, 108 are employed in conjunction with the A-to-D converter 102 to perform two voltage measurements (f1, f2) at the common node 126, which are subsequently used to generate an expression defining the capacitance of the variable capacitor Cx 106. In this mode of operation, the generated expression of variable capacitance is substantially independent of measurement error resulting from the sample-and-hold capacitance (Csh) and the parasitic capacitance (Cp).

Each of the voltage measurements (f1, f2) performed by the capacitance measurement system 100 may be described with reference to three phases, namely, a charge reference phase, a charge redistribution and sampling phase, and a hold and ADC conversion phase. Further, each of the three phases corresponds to a particular configuration of the array of switches Sr 130, Sx 132, So 134, and Sp 110. Specifically, the first voltage measurement (f1) may be described with reference to three phases 1a-3a as follows.

Phase 1a: (i) Sp 110 is positioned to connect the common node 126 to ground.
   (ii) So 134 is positioned to connect the terminal 135 of Co 108 to ground.
   (iii) Sx 132 is positioned to connect the terminal 133 of Cx 106 to ground.
   (iv) Sr 130 is positioned to connect the terminal 131 of Cr 104 to Vcc.
   (v) The S/H switch Sh is placed in the closed position.
Phase 2a: (i) Sp 110 is placed in the open position.
   (ii) So 134 is positioned to connect the terminal 135 of Co 108 to Vcc.
   (iii) Sx 132 is positioned to connect the terminal 133 of Cx 106 to Vcc.
   (iv) Sr 130 is positioned to connect the terminal 131 of Cr 104 to ground.
Phase 3a: (i) The S/H switch Sh is placed in the open position.
   (ii) The A-to-D converter 102 performs the first voltage measurement (f1).

Like the first voltage measurement (f1), the second voltage measurement (f2) may be described with reference to three phases 1b-3b as follows.

Phase 1b: (i) Sp 110 is positioned to connect the common node 126 to ground.
   (ii) So 134 is positioned to connect the terminal 135 of Co 108 to ground.
   (iii) Sx 132 is positioned to connect the terminal 133 of Cx 106 to Vcc.
   (iv) Sr 130 is positioned to connect the terminal 131 of Cr 104 to ground.
   (v) The S/H switch Sh is placed in the closed position.
Phase 2b: (i) Sp 110 is placed in the open position.
   (ii) So 134 is positioned to connect the terminal 135 of Co 108 to Vcc.
   (iii) Sx 132 is positioned to connect the terminal 133 of Cx 106 to ground.
   (iv) Sr 130 is positioned to connect the terminal 131 of Cr 104 to Vcc.
Phase 3b: (i) The S/H switch Sh is placed in the open position.
   (ii) The A-to-D converter 102 performs the second voltage measurement (f2).

It is understood that the voltage at the common node 126 is allowed to settle before entering the hold phase in each of the first and second voltage measurements (f1, f2) described above. It is also understood that steps (ii), (iii), and (iv) of Phase 2a above can be performed substantially simultaneously, and that steps (ii), (iii), and (iv) of Phase 2b above can be performed substantially simultaneously.

Those of ordinary skill in this art will appreciate that the first and second voltage measurements (f1, f2) performed above may be described in terms of the following equations:

$$f1/(2^N-1)*Vref \cong (Cx-Cr+Co)/Ctot*Vcc+\Delta V \qquad (1)$$

$$f2/(2^N-1)*Vref \cong (Cr-Cx+Co)/Ctot*Vcc+\Delta V, \qquad (2)$$

in which "Ctot" is the total capacitance at the common node 126, i.e., Csh+Cp+Cr+Cx+Co, "$\Delta V$" is equal to Vos+Io*ts/Ctot, "Vos" is the offset voltage of the ADC comparator, "Io" is the leakage current, and "ts" corresponds to the sample time. With reference to the three phases 1a-3a above, the sample time ts corresponds to the time between the opening of the switch Sp 110 in step (i) of Phase 2a, and the opening of the S/H switch Sh in step (i) of Phase 3a. Similarly, with reference to the three phases 1b-3b above, the sample time ts corresponds to the time between the opening of the switch Sp 110 in step (i) of Phase 2b, and the opening of the S/H switch Sh in step (i) of Phase 3b. In addition, each of the first and second voltage measurements f1 and f2 ranges from 0 to $2^N-1$, in which "N" is equal to the number of A-to-D converter bits. For example, for a 10-bit A-to-D converter, $2^N-1$ is equal to 1023.

Equations 1-2 above can be used to eliminate the sample-and-hold capacitance (Csh) and the parasitic capacitance (Cp). For example, equations 1-2 can be combined to obtain the expression $$(Cx-Cr)/Co \cong (f1-f2)/(f1+f2-2\Delta V/Vref*(2^N-1)), \quad (3)$$

which is independent of the sample-and-hold capacitance (Csh) and the parasitic capacitance (Cp) output error sources. It is noted that the effect of the error voltage □V is substantially reduced by the "(f1−f2)" term included in equation (3) above.

Figure 1B:
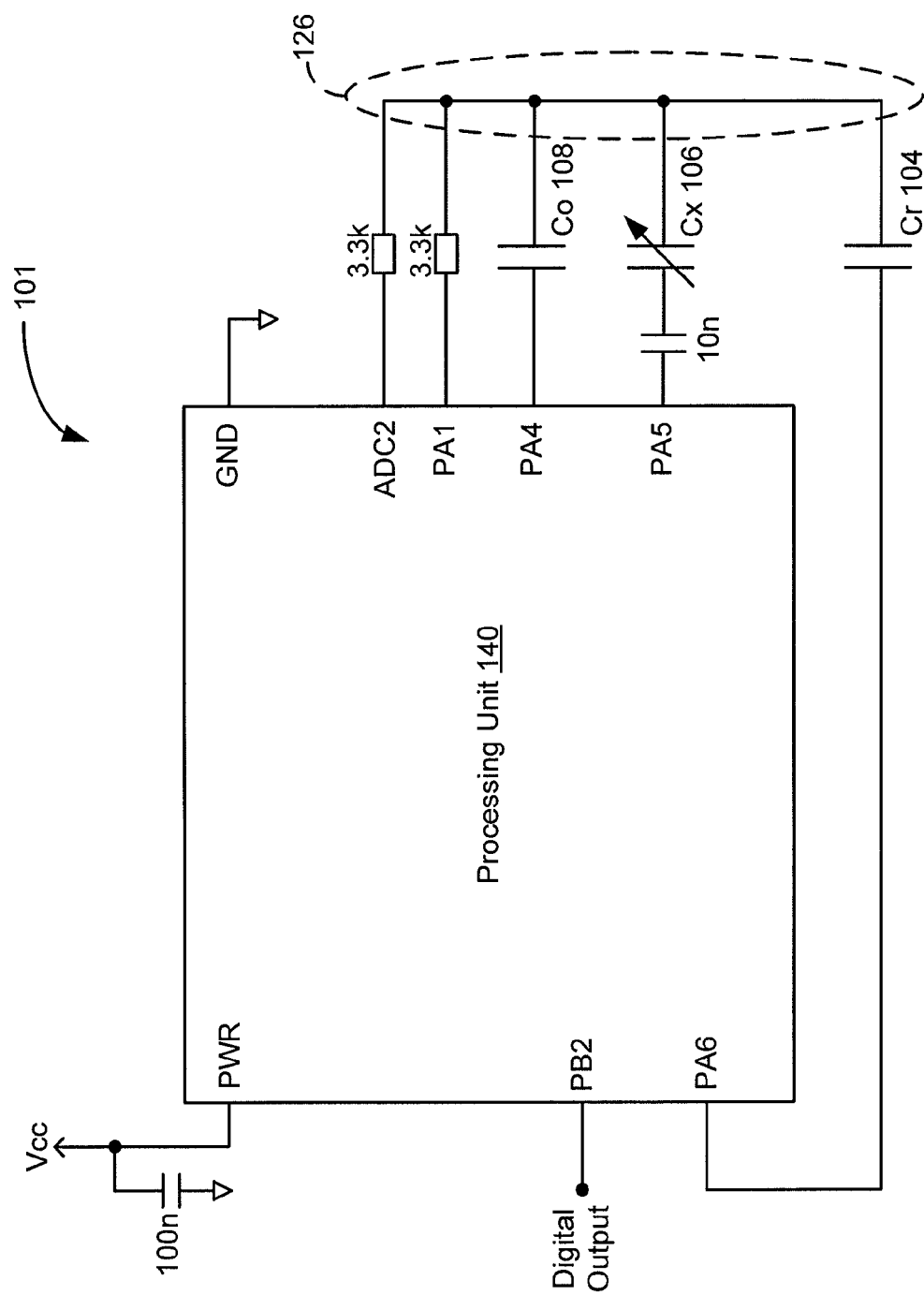

FIG. 1b depicts an illustrative embodiment of a processor-based implementation 101 of the capacitance measurement system 100 (see FIG. 1a). As shown in FIG. 1b, the processor-based implementation 101 includes a processing unit 140, which is an integrated circuit containing signal processing circuitry, circuitry corresponding to the array of switches Sr 130, Sx 132, So 134, Sp 110, timing and logic circuitry for controlling the operation of the switches Sr, Sx, So, Sp, and circuitry corresponding to an implementation of the A-to-D converter 102. It is appreciated that in an alternative embodiment, the A-to-D converter may be implemented separately from the processing unit 140. The processor-based implementation 101 further includes the variable capacitor Cx 106, the reference capacitor Cr 104, and the reference capacitor Co 108. The processor-based implementation 101 of FIG. 1b may be employed to generate a representation of equation (3) above, defining the capacitance of the variable capacitor Cx 106. For example, the processing unit 140 may be implemented using the ATtiny44 microcontroller sold by Atmel Corporation, San Jose, Calif., USA, or any other suitable microprocessor or microcontroller. Further, the A-to-D converter may be implemented as a 10-bit successive approximation A-to-D converted, or any other suitable type of A-to-D converter. It is noted that the processor-based implementation 101 of FIG. 1b includes a number of representative resistor and capacitor components having nominal values that are suitable for a typical implementation using the ATtiny44 device.

For example, the processing unit 140 containing a 10-bit A-to-D converter may be employed to obtain an estimate of the number of ADC counts produced at the ADC output in response to a full scale capacitance change (ΔCx). Using the first mode of operation described above, and omitting the "□V/Vref" output error source, equations 1-2 above may be rewritten to obtain the following expressions defining the first and second voltage measurements (f1, f2):

$$f1/(2^N-1) \cong (Cx+Co-Cr)/(Csh+Cp+Cx+Co+Cr)*Vcc/Vref \quad (4)$$

$$f2/(2^N-1) \cong (Cr+Co-Cx)/(Csh+Cp+Cx+Co+Cr)*Vcc/Vref \quad (5)$$

In this illustrative example, the full scale capacitance change (ΔCx) is equal to 12 pF (ΔCx=(48−36) pF). Further, "Co" is equal to 15 pF, "Cr" is equal to 42 pF, "Csh" is equal to 14 pF, and "Cp" is equal to 3 pF, which are suitable nominal values for the processor-based implementation 101 of FIG. 1b. In addition, "Vref" is equal to 2.0 volts, "Vcc" is equal to 5.0 volts, and the A-to-D converter is a 10-bit ADC, i.e., the maximum ADC count is $2^{10}-1$ or 1023.

If Cx is equal to 48 pF, then f1=(48+15−42)/(14+3+48+15+42)*5.0/2.0*1023=440 counts, for a 10-bit ADC, and f2=189 counts, for a 10-bit ADC.

In addition, if Cx is equal to 36 pF, then f1=(36+15−42)/(14+3+36+15+42)*5.0/2.0*1023=209 counts, for a 10-bit ADC, and f2=488 counts, for a 10-bit ADC.

The full scale counts at Cx=48 pF and Cx=36 pF may therefore be obtained as follows.

Cx=48 pF; (f1−f2)=440−189=251 counts

Cx=36 pF; (f1−f2)=209−488=−279 counts

Accordingly, in this example, the full scale capacitance change (ΔCx=12 pF) produces a total (f1−f2) change of 530 counts (i.e., 251+279), and a much smaller (f1+f2) change of 68 counts (i.e., 440+189−209−488).

In a second mode of operation, the switched variable and reference capacitors 104, 108, 108 are employed in conjunction with the A-to-D converter within the processing unit 140 to perform three voltage measurements (f1, f2, f3) at the common node 126 for use in generating an expression defining the capacitance of the variable capacitor Cx 106.

In this second mode of operation, the generated expression of variable capacitance is substantially independent of measurement error resulting from the sample-and-hold capacitance (Csh), the parasitic capacitance (Cp) at the input of the A-to-D converter, the sample-and-hold offset voltage (Vos), and the leakage current (lo) at the A-to-D converter input.

Like the first mode of operation described above, each of the three voltage measurements (f1, f2, f3) performed by the processor-based implementation 101 in this second mode of operation may be described with reference to three phases, each phase corresponding to a particular configuration of the array of switches Sr 130, Sx 132, So 134, and Sp 110. Specifically, the first and second voltage measurements (f1, f2) may be performed as described above with reference to phases 1a-3a and 1b-3b, respectively. Further, the third voltage measurement (f3) may be described with reference to three phases 1c-3c as follows, assuming Sp 210 (see FIG. 2a) replaces Sp 110 (see FIG. 1a).

Phase 1c: (i) Sp 110 is positioned to connect the common node 126 to Vref.
 (ii) So 134 is positioned to connect the terminal 135 of Co 108 to Vcc.
 (iii) Sx 132 is positioned to connect the terminal 133 of Cx 106 to Vcc.
 (iv) Sr 130 is positioned to connect the terminal 131 of Cr 104 to ground.
 (v) The S/H switch Sh is placed in the closed position.

Phase 2c, (i) Sp 110 is placed in the open position.
 (ii) So 134 is positioned to connect the terminal 135 of Co 108 to ground.
 (iii) Sx 132 is positioned to connect the terminal 133 of Cx 106 to ground.
 (iv) Sr 130 is positioned to connect the terminal 131 of Cr 104 to Vcc.

Phase 3c: (i) The S/H switch Sh is placed in the open position.
 (ii) The A-to-D converter 102 performs the third voltage measurement (f3).

In this description of the second mode of operation, it is assumed that the A-to-D converter included in the processing unit 140 is a 10-bit ADC. In addition, it is assumed that the processing unit 140 includes an internal reference voltage Vref (not shown).

Those of ordinary skill in this art will appreciate that the third voltage measurement (f3) performed above may be described in terms of the following equation:

$$Vref-f3/(2^N-1)*Vref \cong (Cx-Cr+Co)/Ctot*Vcc-\Delta V. \qquad (6)$$

Combining equations 1, 2, and 6 above, the □V/Vref error in equation 3 can be eliminated, i.e., $$(Cx-Cr)/Co \cong (f1-f2)/(f2+(2^N-1)-f3), \qquad (7)$$

in which "N" is equal to the number of A-to-D converter bits. For example, for a 10-bit A-to-D converter, $2^N-1$ is equal to 1023. The A-to-D conversions f1, f2, and f3 can therefore range from 0 to 1023.

Figure 2A:
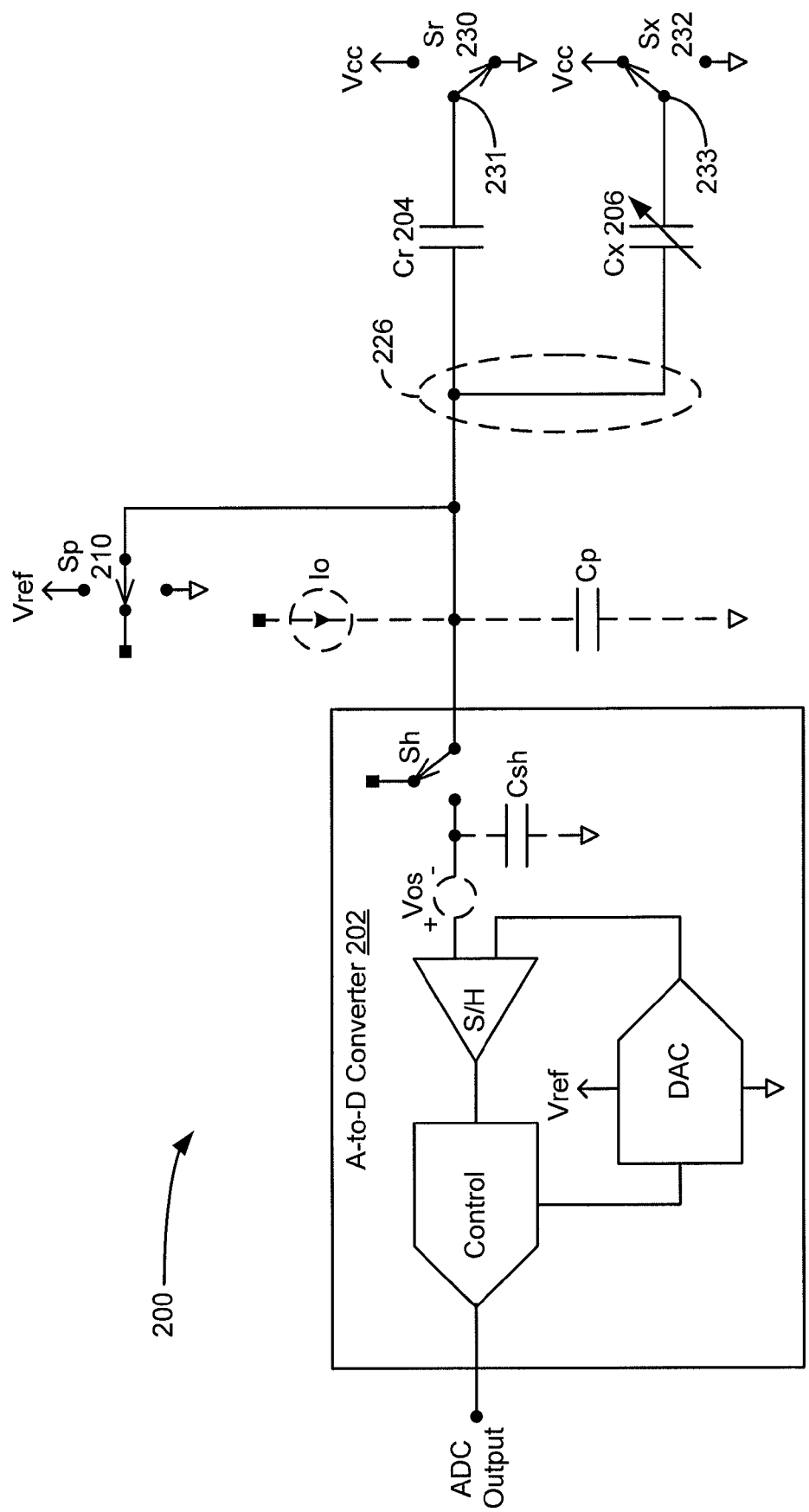

FIG. 2a depicts an alternative embodiment of the capacitance measurement system 100 (see FIG. 1a). Whereas the capacitance measurement system 100 of FIG. 1a includes the variable capacitor Cx 106 and the two reference capacitors Cr 104, Co 108, the alternative embodiment of FIG. 2a comprises a capacitance measurement system 200 that includes a variable capacitor Cx 206 and a single reference capacitor Cr 204. As shown in FIG. 2a, the capacitance measurement system 200 further includes an analog-to-digital (A-to-D) converter sub-system 202, which has an A-to-D converter control component (Control), a digital-to-analog converter (DAC), and a sample-and-hold comparator (S/H) with a sample-and-hold switch (Sh). The capacitance measurement system 200 also includes an array of switches Sr 230, Sx 232, and Sp 210. Specifically, the variable capacitor Cx 206 and the reference capacitor Cr 204 are connected to one another to form a common node 226, which in turn is connected to the sample-and-hold circuit (S/H) within the A-to-D converter 202 via the sample-and-hold switch (Sh). The switch Sx 232 is a single pole/double throw (SPDT) switch operative to switchingly connect a terminal 233 of the variable capacitor Cx 206 to the supply voltage Vcc and ground. Similarly, the switch Sr 230 is a SPDT switch operative to switchingly connect a terminal 231 of the reference capacitor Cr 204 to the supply voltage Vcc and ground. The switch Sp 210 is a three-position switch that can be placed in a first position to connect the common node 226 to a reference voltage Vref, a second open position, and a third position to connect the common node 226 to ground. The S/H switch (Sh) included in the A-to-D converter 202 is a two-position switch operative to switch between an open position and a closed position, which connects the common node 226 to the sample-and-hold capacitor (Csh) within the A-to-D converter 202.

Like the A-to-D converter 102 (see FIG. 1a), the structure and operation of the A-to-D converter sub-system 202 of FIG. 2a is conventional, and therefore a detailed description of the structure and operation of the A-to-D converter 202 is omitted for clarity of discussion. For example, the A-to-D converter sub-system 202 may be implemented as a 10-bit successive approximation ADC, or any other suitable type of ADC.

Accordingly, the A-to-D converter 202 is operative to provide an ADC output, which is a multi-bit digital representation of the voltage at the common node 226 of the variable and reference capacitors 204, 206. As shown in FIG. 2a, the digital voltage representation at the ADO output may have multiple sources of error, including but not limited to a sample-and-hold capacitance (Csh), a parasitic capacitance (Cp) at the input of the A-to-D converter 202 including the trace capacitance of the common node 226, a sample-and-hold offset voltage (Vos), and a leakage current (Io) at the A-to-D converter input.

In one mode of operation, the switched variable and and reference capacitors 204, 206 are employed in conjunction with the A-to-D converter 202 to perform four voltage measurements (f1, f2, f3, f4) at the common node 226, which are subsequently used to generate an expression defining the capacitance of the variable capacitor Cx 206. In this mode of operation, the generated expression of variable capacitance is substantially independent of measurement error resulting from the sample-and-hold capacitance (Csh), the parasitic capacitance (Cp) including the trace capacitance of the common node 226, the sample-and-hold offset voltage (Vos), the leakage current (Io), the reference voltage Vref, the supply voltage Vcc, and the sample time (ts).

Each of the voltage measurements (f1, f2, f3, f4) performed by the capacitance measurement system 200 may be described with reference to three phases namely, a charge reference phase, a charge redistribution and sampling phase, and a hold and ADC conversion phase. Further, each of the three phases corresponds to a particular configuration of the array of switches Sr 230, Sx 232, and Sp 210. Specifically, the first voltage measurement (f1) may be described with reference to three phases 1*d*-3*d* as follows.

Phase 1*d*: (i) Sp 210 is positioned to connect the common node 226 to ground.
    (ii) Sx 232 is positioned to connect the terminal 233 of Cx 206 to ground.
    (iii) Sr 230 is positioned to connect the terminal 231 of Cr 204 to Vcc.
    (iv) The S/H switch Sh is placed in the closed position.

Phase 2*d*: (i) Sp 210 is placed in the open position.
    (ii) Sx 232 is positioned to connect the terminal 233 of Cx 206 to Vcc.
    (iii) Sr 230 is positioned to connect the terminal 231 of Cr 204 to ground.

Phase 3*d*: (i) The S/H switch Sh is placed in the open position,
    (ii) The A-to-D converter 202 performs the first voltage measurement (f1).

The second voltage measurement (f2) may be described with reference to three phases 1*e*-3*e* as follows.

Phase 1*e*: (i) Sp 210 is positioned to connect the common node 226 to ground.
    (ii) Sx 232 is positioned to connect the terminal 233 of Cx 206 to Vcc.
    (iii) Sr 230 is positioned to connect the terminal 231 of Cr 204 to ground.
    (iv) The S/H switch Sh is placed in the closed position.

Phase 2*e*: (i) Sp 210 is placed in the open position.
    (ii) Sr 230 is positioned to connect the terminal 231 of Cr 204 to Vcc.

Phase 3*e*: (i) The S/H switch Sh is placed in the open position.
    (ii) The A-to-D converter 202 performs the second voltage measurement (f2).

The third voltage measurement (f3) may be described with reference to three phases 1*f*-3*f* as follows.

Phase 1*f*: (i) Sp 210 is positioned to connect the common node 226 to Vref.
    (ii) Sx 232 is positioned to connect the terminal 233 of Cx 206 to Vcc.
    (iii) Sr 230 is positioned to connect the terminal 231 of Cr 204 to ground.
    (iv) The S/H switch Sh is placed in the closed position.

Phase 2*f*: (i) Sp 210 is placed in the open position.
    (ii) Sx 232 is positioned to connect the terminal 233 of Cx 206 to ground.
    (iii) Sr 230 is positioned to connect the terminal 231 of Cr 204 to Vcc.

Phase 3f: (i) The S/H switch Sh is placed in the open position.
  (ii) The A-to-D converter 202 performs the third voltage measurement (f3).

The fourth voltage measurement (f4) may be described with reference to three phases 1g-3g as follows.

Phase 1g: (i) Sp 210 is positioned to connect the common node 226 to Vref.
  (ii) Sx 232 is positioned to connect the terminal 233 of Cx 206 to ground.
  (iii) Sr 230 is positioned to connect the terminal 231 of Cr 204 to Vcc.
  (iv) The S/H switch Sh is placed in the closed position.

Phase 2g: (i) Sp 210 is placed in the open position.
  (ii) Sr 230 is positioned to connect the terminal 231 of Cr 204 to ground.

Phase 3g: (i) The S/H switch Sh is placed in the open position.
  (ii) The A-to-D converter 202 performs the fourth voltage measurement (f4).

It is understood that the voltage at the common node 226 is allowed to settle before entering the hold phase in each of the first second, third, and fourth voltage measurements (f1, f2, f3, f4) described above.

Those of ordinary skill in this art will appreciate that the first, second, third, and fourth voltage measurements (f1, f2, f3, f4) performed above may be described in terms of the following equations:

$$f1/(2^N-1)*Vref \cong (Cx-Cr)/Ctot*Vcc+\square V \quad (8)$$

$$f2/(2^N-1)*Vref \cong Cr/Ctot*Vcc\square V \quad (9)$$

$$Vref-f3/(2^N-1)*Vref \cong (Cx-Cr)/Ctot*Vcc-\square V \quad (10)$$

$$Vref-f4/(2^N-1)*Vref \cong Cr/Ctot*Vcc-\square V \quad (11)$$

in which "Ctot" is equal to the sum of the capacitances Cx, Cr, Csh, and Cp, "□V" is equal to Vos+lo*ts/Ctot, "Vos" is the offset voltage of the ADC comparator, "lo" is the leakage current, and "ts" corresponds to the sample time. With reference to phases 1d-3d, 1e-3e, 1f-3f, and 1g-3g above, the sample time ts corresponds to the time between the opening of the switch Sp 210 in step (i) of Phases 2d, 2e, 2f, and 2g, and the opening of the S/H switch Sh in step (i) of Phases 3d, 3e, 3f, and 3g, respectively.

Further, the equations 9-11 above may be combined to obtain the following expression defining the capacitance of the variable capacitor Cx 206:

$$(Cx-Cr)/Cr \cong ((2^N-1)+f1-f3)/((2^N-1)+f2-f4), \quad (12)$$

which is independent of a number of output error sources including the sample-and-hold capacitance (Csh), the parasitic capacitance (Cp), and the error sources in □V above, i.e., the offset voltage "Vos" of the ADC comparator, the input leakage current "lo", and the sample time "ts", as defined above with reference to phases 1d-3d, 1e-3e, 1f-3f, and 1g-3g.

Figure 2B:
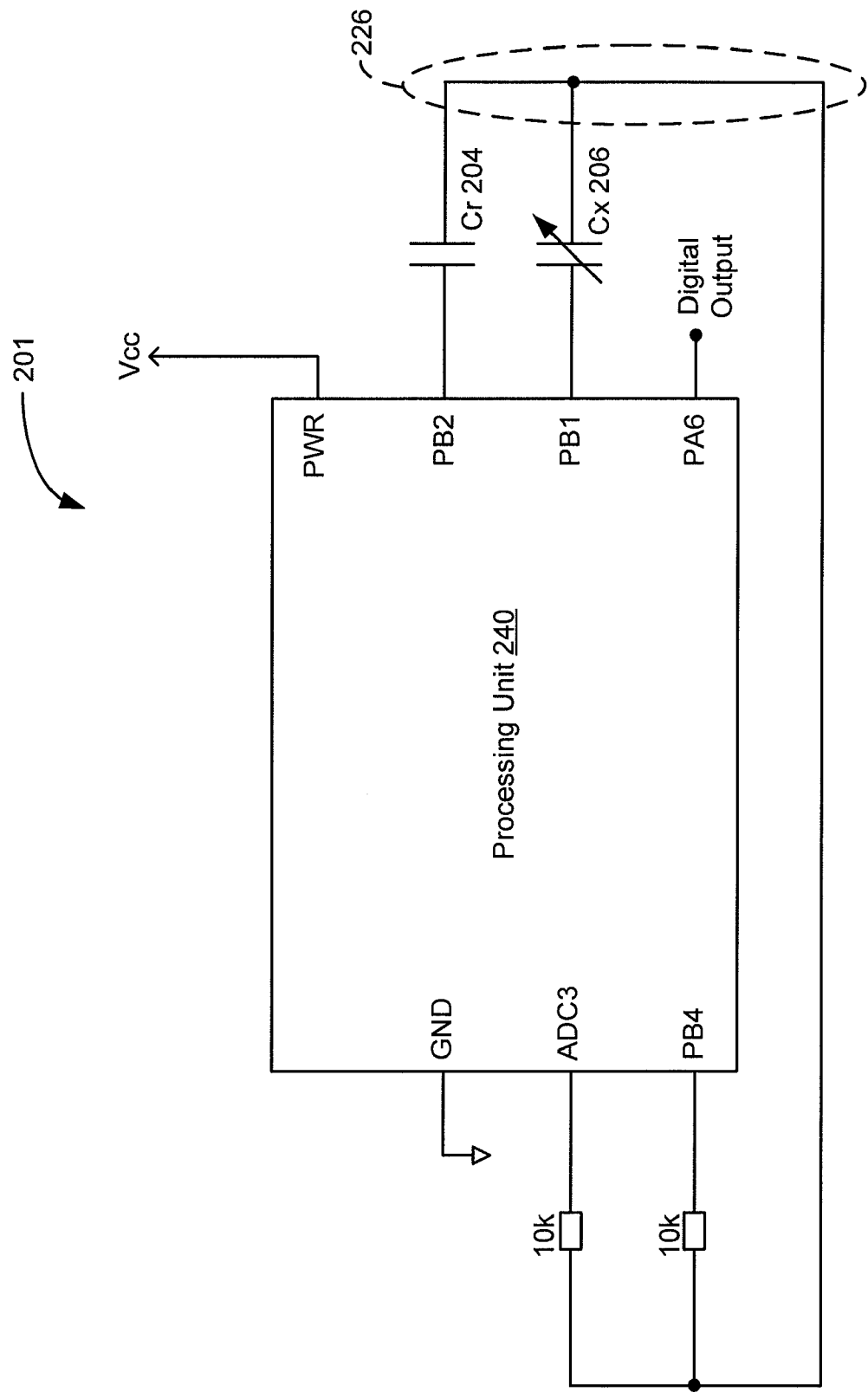

FIG. 2b depicts an illustrative embodiment of a processor-based implementation 201 of the capacitance measurement system 200 (see FIG. 2a). As shown in FIG. 2b, the processor-based implementation 201 includes a processing unit 240, which is an integrated circuit containing circuitry (not shown) corresponding to a 10-bit implementation of the A-to-D converter 202 (see FIG. 2a) It is appreciated that in an alternative embodiment; the A-to-D converter may be implemented separately from the processing unit 240. The processor-based implementation 201 further includes the variable capacitor Cx 206 and the reference capacitor Cr 204. The processor-based implementation 201 of FIG. 2b may be employed to generate a representation of equation (12) above, defining the capacitance of the variable capacitor Cx 206. Like the processing unit 140 (see FIG. 1b), the processing unit 240 may be implemented using the ATtiny44 microcontroller sold by Atmel Corporation, or any other suitable microprocessor or microcontroller. It is noted that the processor-based implementation 201 of FIG. 2b includes a number of representative resistor components having nominal values that are suitable for a typical implementation using the ATtiny44 device.

In a second mode of operation of the capacitance measurement system 200 (see FIG. 2a), the switched variable and reference capacitors 204, 206 are employed in conjunction with the A-to-D converter within the processing unit 240 to perform three voltage measurements (f1, f2, f3) at the common node 226 for use in generating an expression defining the capacitance of the variable capacitor Cx 206. In this second mode of operation of the system 200, the generated expression of variable capacitance is substantially independent of measurement error resulting from the the sample-and-hold capacitance (Csh), the parasitic capacitance (Cp), and the error sources in V above, i.e., the offset voltage "Vos" of the ADC comparator, the input leakage current "lo", and the sample time "ts".

Each of the three voltage measurements (f1, f2, f3) performed by the processor-based implementation 201 in this second mode of operation may be described with reference to three phases, each phase corresponding to a particular configuration of the array of switches Sr 230, Sx 232, and Sp 210. Specifically, the first voltage measurement (f1) may be described with reference to three phases 1h-3h as follows.

Phase 1h: (i) Sp 210 is positioned to connect the common node 226 to ground.
  (ii) Sx 232 is positioned to connect the terminal 233 of Cx 206 to ground.
  (iii) Sr 230 is positioned to connect the terminal 231 of Cr 204 to ground.
  (iv) The S/H switch Sh is placed in the closed position.

Phase 2h: (i) Sp 210 is placed in the open position.
  (ii) Sx 232 is positioned to connect the terminal 233 of Cx 206 to Vcc.

Phase 3h: (i) The S/H switch Sh is placed in the open position.
  (ii) The A-to-D converter 202 performs the first voltage measurement (f1).

The second voltage measurement (f2) may be described with reference to three phases 1i-3i as follows.

Phase 1i: (i) Sp 210 is positioned to connect the common node 226 to ground.
  (ii) Sx 232 is positioned to connect the terminal 233 of Cx 206 to ground.
  (iii) Sr 230 is positioned to connect the terminal 231 of Cr 204 to ground.
  (iv) The S/H switch Sh is placed in the closed position.

Phase 2i: (i) Sp 210 is placed in the open position.
  (ii) Sr 230 is positioned to connect the terminal 231 of Cr 204 to Vcc.

Phase 3i: (i) The S/H switch Sh is placed in the open position.
  (ii) The A-to-D converter 202 performs the second voltage measurement (f2).

The third voltage measurement (f3) may be described with reference to three phases 1j-3j as follows.

Phase 1j: (i) Sp 210 is positioned to connect the common node 226 to Vref.
  (ii) Sx 232 is positioned to connect the terminal 233 of Cx 206 to ground.

(iii) Sr 230 is positioned to connect the terminal 231 of Cr 204 to Vcc.

(iv) The S/H switch Sh is placed in the closed position.

Phase 2j: (i) Sp 210 is placed in the open position.

(ii) Sr 230 is positioned to connect the terminal 231 of Cr 204 to ground.

Phase 3j: (i) The S/H switch Sh is placed in the open position.

(ii) The A-to-D converter 202 performs the third voltage measurement (f3).

In this description of the second mode of operation of the capacitance measurement system 200, it is assumed that the A-to-D converter included in the processing unit 240 is a 10-bit ADC. In addition, it is assumed that the processing unit 240 includes an internal reference voltage Vref (not shown).

In this second mode of operation of the capacitance measurement system 200, the first, second, and third voltage measurements (f1, f2, f3) may be described using the following equations, $$f1/(2^N-1)*Vref \cong Cx/Ctot*Vcc+lo*ts/Ctot+Vos \quad (13)$$

$$f2/(2^N-1)*Vref \cong Cr/Ctot*Vcc+lo*ts/Ctot+Vos \quad (14)$$

$$Vref-f3/(2^N-1)*Vref \cong Cr/Ctot*Vcc-lo*ts/Ctot-Vos, \quad (15)$$

in which "Ctot" is equal to the sum of the capacitances Cx, Cr, Csh, and Cp. Equations 14-15 above can be combined to obtain the following expression:

$$lo*ts/Ctot+Vos \cong (f2/(2^N-1)+f3/(2^N-1)-1)/2*Vref. \quad (16)$$

Next, equation (16) above can be subtracted from each of the equations 13-14 above to obtain the following expressions:

$$Cx/Ctot*Vcc \cong f1/(2^N-1)*Vref-(f2/(2^N-1)+f3/(2^N-1)-1)/2*Vref, \text{ and} \quad (17)$$

$$Cr/Ctot*Vcc \cong f2/(2^N-1)*Vref-(f2/(2^N-1)+f3/(2^N-1)-1)/2*Vref. \quad (18)$$

Finally, equation (18) above can be divided by equation (17) above to obtain the following expression defining the capacitance of the variable capacitor Cx 206:

$$Cr/Cx \cong ((2^N-1)+f2-f3)/((2^N-1)+2*f1-f2-f3), \quad (19)$$

which is independent of the sample-and-hold capacitance (Csh), the parasitic capacitance (Cp), the sample-and-hold offset voltage (Vos), the leakage current (lo), the reference voltage Vref, the supply voltage Vcc, and the sample time (ts).

Figure 3:
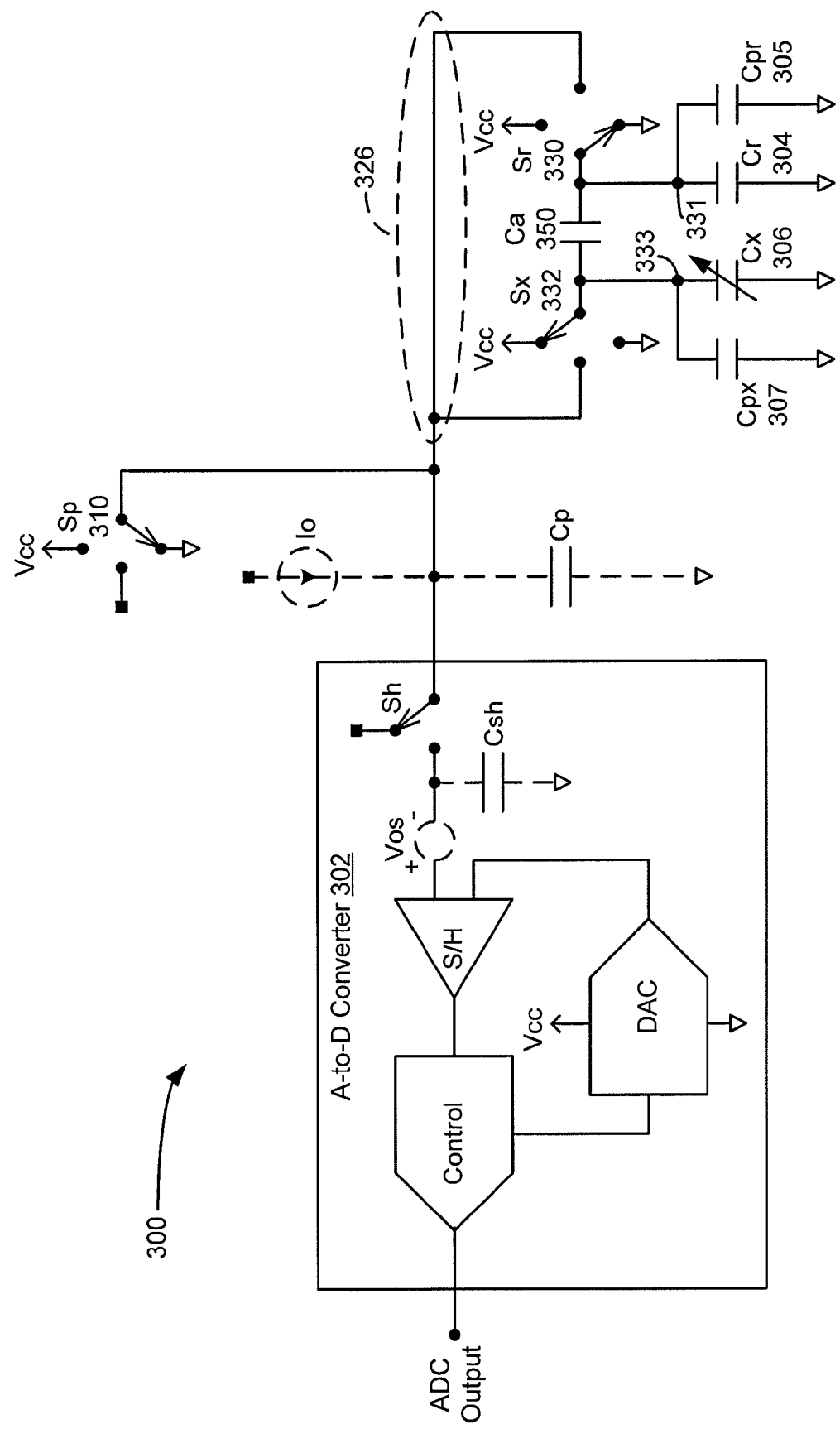

Having described the above illustrative embodiments, other alternative embodiments or variations may be made. For example, FIG. 3 depicts a capacitance measurement system 300 in which the variable capacitor Cx and the reference capacitor Cr are in grounded configurations. Specifically, the capacitance measurement system 300 includes the variable capacitor Cx 306 and an associated parasitic capacitance Cpx 307, and the reference capacitor Cr 304 and an associated parasitic capacitance Cpr 305. As shown in FIG. 3, the capacitance measurement system 300 further includes an analog-to-digital (A-to-D) converter sub-system 302, which includes an A-to-D converter control component (Control), a digital-to-analog converter (DAC), and a sample-and-hold comparator (S/H) having a sample-and-hold switch (Sh). The capacitance measurement system 300 also includes an array of switches Sr 330, Sx 332, and Sp 310. Specifically, the variable capacitor Cx 306 and the reference capacitor Cr 304 are switchingly connectable to one another via the switches Sx 332 and Sr 330 to form a common node 326, which is connected to the sample-and-hold circuit (S/H) via the sample-and-hold switch (Sh). The variable capacitor Cx 306 and the reference capacitor Cr 304 are also connected to one another via a parasitic capacitor Ca 350. The switch Sx 332 is a three-position switch operative to connect the capacitors Cx. Cpx to the supply voltage Vcc, the common node 326, and ground. Similarly, the switch Sr 330 is a three-position switch operative to connect the capacitors Cr, Cpr to the supply voltage Vcc, the common node 326, and ground. In addition, the switch Sp 310 is a three-position switch that can be placed in a first position to connect the common node 326 to the supply voltage Vcc, a second open position, and a third position to connect the common node 326 to ground. The S/H switch (Sh) included in the A-to-D converter 302 is a two-position switch operative to switch between an open position and a closed position, which connects the common node 326 to the sample-and-hold circuit (S/H). The structure and operation of the A-to-D converter subsystem 302 is conventional, and therefore a detailed description of such structure and operation of the A-to-D converter 302 is omitted for clarity of discussion. For example, the A-to-D converter sub-system 302 may be implemented as a 10-bit successive approximation ADC, or any other suitable type of ADC.

Accordingly, the A-to-D converter 302 is operative to provide an ADC output, which is a multi-bit digital representation of the voltage at the common node 326. As shown in FIG. 3, the digital voltage representation at the ADC output may have multiple sources of error, including but not limited to a sample-and-hold capacitance (Csh), a parasitic capacitance (Cp) at the input of the A-to-D converter 302 and at the common node 326, a sample-and-hold offset voltage (Vos), and a leakage current (lo) at the A-to-D converter input.

In one mode of operation, the switched variable and reference capacitors 304, 306 are employed in conjunction with the A-to-D converter 302 to perform four voltage measurements (f1, f2, f3, f4) at the common node 326, which may subsequently be used to generate an expression defining the capacitance of the variable capacitor Cx 306. In this mode of operation, the generated expression of variable capacitance is substantially independent of measurement error resulting from the sample-and-hold capacitance (Csh), the parasitic capacitance (Cp), the sample-and-hold offset voltage (Vos), the leakage current (lo), the supply voyage Vcc, and the sample time (ts).

Each of the voltage measurements (f1, f2, f3, f4) performed by the capacitance measurement system 300 may be described with reference to three phases, namely, a charge reference phase, a charge redistribution phase and sampling phase, and a hold and ADC conversion phase. Further, each of the three phases corresponds to a particular configuration of the array of switches Sr 330, Sx 332, and Sp 310. Specifically, the first voltage measurement (f1) may be described with reference to three phases 1k-3k as follows.

Phase 1k; (i) Sp 310 is positioned to connect the common node 326 to ground.

(ii) Sx 332 is positioned to connect the terminal 333 of Cx 306 to Vcc.

(iii) Sr 330 is positioned to connect the terminal 331 of Cr 304 to ground.

(iv) The S/H switch Sh is placed in the closed position.

Phase 2k; (i) Sp 310 is placed in the open position.

(ii) Sx 332 is positioned to connect the terminal 333 of Cx 306 to the common node 326.

(iii) Sr 330 is positioned to connect the terminal 331 of Cr 304 to the common node 326.

Phase 3k: (i) The S/H switch Sh is placed in the open position.
  (ii) The A-to-D converter 302 performs the first voltage measurement (f1).
The second voltage measurement (f2) may be described with reference to three phases 1l-3l as follows.
Phase 1l: (i) Sp 310 is positioned to connect the common node 326 to ground.
  (ii) Sx 332 is positioned to connect the terminal 333 of Cx 306 to ground.
  (iii) Sr 330 is positioned to connect the terminal 331 of Cr 304 to Vcc.
  (iv) The S/H switch Sh is placed in the closed position.
Phase 2l: (i) Sp 310 is placed in the open position.
  (ii) Sx 332 is positioned to connect the terminal 333 of Cx 306 to the common node 326.
  (iii) Sr 330 is positioned to connect the terminal 331 of Cr 304 to the common node 326.
Phase 3l: (i) The S/H switch Sh is placed in the open position.
  (ii) The A-to-D converter 302 performs the second voltage measurement (f2).
The third voltage measurement (f3) may be described with reference to three phases 1m-3m as follows.
Phase 1m: (i) Sp 310 is positioned to connect the common node 326 to Vcc.
  (ii) Sx 332 is positioned to connect the terminal 333 of Cx 306 to ground.
  (iii) Sr 330 is positioned to connect the terminal 331 of Cr 304 to Vcc.
  (iv) The S/H switch Sh is placed in the closed position.
Phase 2m, (i) Sp 310 is placed in the open position.
  (ii) Sx 332 is positioned to connect the terminal 333 of Cx 306 to the common node 326.
  (iii) Sr 330 is positioned to connect the terminal 331 of Cr 304 to the common node 326.
Phase 3m: (i) The S/H switch Sh is placed in the open position.
  (ii) The A-to-D converter 302 performs the third voltage measurement (f3).
The fourth voltage measurement (f4) may be described with reference to three phases 1n-3n as follows.
Phase 1n: (i) Sp 310 is positioned to connect the common node 326 to Vcc.
  (ii) Sx 332 is positioned to connect the terminal 333 of Cx 306 to Vcc.
  (iii) Sr 330 is positioned to connect the terminal 331 of Cr 304 to ground.
  (iv) The S/H switch Sh is placed in the closed position.
Phase 2n: (i) Sp 310 is placed in the open position.
  (ii) Sx 332 is positioned to connect the terminal 333 of Cx 306 to the common node 326.
  (iii) Sr 330 is positioned to connect the terminal 331 of Cr 304 to the common node 326.
Phase 3n: (i) The S/H switch Sh is placed in the open position.
  (ii) The A-to-D converter 302 performs the fourth voltage measurement (f4).
It is understood that the voltage at the common node 326 is allowed to settle before entering the sampling phase in each of the first, second, third, and fourth voltage measurements (f1, f2, f3, f4) described above.
Those of ordinary skill in this art will appreciate that the first, second, third, and fourth voltage measurements (f1, f2, f3, f4) performed above may be described in terms of the following equations:

$$f1/(2^N-1)*Vcc \cong (Cx+Cpx)/Ctot*Vcc+\Box V \quad (20)$$

$$f2/(2^N-1)*Vcc \cong (Cr+Cpr)/Ctot*Vcc+\Box V \quad (21)$$

$$Vcc-f3/(2^N-1)*Vcc \cong (Cx+Cpx)/Ctot*Vcc-\Box V \quad (22)$$

$$Vcc-f4/(2^N-1)*Vcc \cong (Cr+Cpr)/Ctot*Vcc-\Box V, \quad (23)$$

in which "$\Box V$" is equal to lo*ts/Ctot+Vos, and "Ctot" is equal to the sum of the capacitances Cx, Cpx, Cr, Cpr, Csh, and Cp. Further, the equations 20-23 may be combined to obtain the following expression defining the capacitance of the variable capacitor Cx 306:

$$(Cr+Cpr)/(Cx+Cpx) \cong ((2^N-1)+f2-f4)/((2^N-1)+f1-f3), \quad (24)$$

which is independent of the sample-and-hold capacitance (Csh), the parasitic capacitance (Cp), the sample-and-hold offset voltage (Vos), the leakage current (lo), the supply voltage Vcc, and the sample time (ts). With reference to phases 1k-3k, 1l-3l, 1m-3m, and 1n-3n above, the sample time ts corresponds to the time between the opening of the switch Sp 310 in step (i) of Phases 2k, 2l, 2m, and 2n, and the opening of the S/H switch Sh in step (i) of Phases 3k, 3l, 3m, and 3n, respectively.

It is noted that the bit resolution of the presently disclosed capacitance measurement system can be increased by increasing the number of ADC bits, e.g., from 10 to 12 bits, and/or by making the value of the reference voltage Vref significantly less than that of the supply voltage Vcc.

As described herein, by providing a capacitance measurement system that includes a circuit configuration having switched variable and reference capacitors connected to one another at a common node, which in turn is connected to the input of an A-to-D converter, a plurality of voltage measurements may be performed at the common node for use in generating an expression that defines the capacitance of the variable capacitor. Based at least in part upon the number of reference capacitors employed in the system and the number of voltage measurements performed at the common node, the generated expression of variable capacitance can be made to be substantially independent of multiple output error sources. It should be appreciated that the generated expression of variable capacitance contains only one division calculation, which can be easily performed by a suitable microprocessor or microcontroller.

It will further be appreciated by those of ordinary skill in the art that modifications to and variations of the above-described system and method of microprocessor-based capacitance measurement may be made without departing from the inventive concepts disclosed herein. Accordingly, the invention should not be viewed as limited except as by the scope and spirit of the appended claims.

What is claimed is:

1. A capacitance measurement system, comprising:
   a switched variable capacitor and at least one switched reference capacitor, said switched variable capacitor and said at least one switched reference capacitor being coupleable to one another to form a common node; and
   an analog-to-digital (A-to-D) converter having an input and an output, the input of said A-to-D converter being connectable to said switched variable capacitor and said at least one switched reference capacitor at the common node,
   wherein said A-to-D converter is operative to perform, at the common node, a plurality of direct voltage measurements, without requiring successive approximation charge balancing, for subsequent use in determining a capacitance of said variable capacitor.

2. The capacitance measurement system of claim 1 wherein said at least one switched reference capacitor comprises a first switched reference capacitor having a capacitance Cr and a second switched reference capacitor having a capacitance Co.

3. The capacitance measurement system of claim 2 wherein said A-to-D converter is operative to perform, at the common node, two voltage measurements f1, f2 for subsequent use in determining a capacitance Cx of said variable capacitor.

4. The capacitance measurement system of claim 2 wherein said A-to-D converter is operative to perform, at the common node, three voltage measurements f1, f2, f3 for subsequent use in determining a capacitance Cx of said variable capacitor.

5. The capacitance measurement system of claim 1 wherein said at least one switched reference capacitor comprises a single switched reference capacitor having a capacitance Cr.

6. The capacitance measurement system of claim 5 wherein said A-to-D converter is operative to perform, at the common node, three voltage measurements f1, f2, f3 for subsequent use in determining a capacitance Cx of said variable capacitor.

7. The capacitance measurement system of claim 5 wherein said A-to-D converter is operative to perform, at the common node, four voltage measurements f1, f2, f3, f4 for subsequent use in determining a capacitance Cx of said variable capacitor.

8. The capacitance measurement system of claim 1 wherein the input of said A-to-D converter is directly connected to said switched variable capacitor and said at least one switched reference capacitor at the common node.

9. The capacitance measurement system of claim 1 wherein said A-to-D converter is operative to provide, at the output, a plurality of digital representations of the voltage measurements, wherein the capacitance measurement system includes a processing unit operative to receive the plurality of digital representations of the voltage measurements, and wherein said processing unit is operative to generate, using the digital representations of the voltage measurements, a representation of an expression defining a capacitance Cx of said variable capacitor.

10. The capacitance measurement system of claim 9 wherein said processing unit is implemented as an integrated circuit, and wherein said processing unit implemented as an integrated circuit includes said A-to-D converter.

11. The capacitance measurement system of claim 9 wherein said at least one switched reference capacitor comprises a first switched reference capacitor having a capacitance Cr and a second switched reference capacitor having a capacitance Co.

12. The capacitance measurement system of claim 11 wherein said A-to-D converter is operative to perform, at the common node, two voltage measurements f1, f2, and to provide, at the output, digital representations of the two voltage measurements f1, f2.

13. The capacitance measurement system of claim 12 wherein said processing unit is operative to generate, using the digital representations of the two voltage measurements f1, f2, the representation of the expression defining a capacitance Cx of said variable capacitor, and wherein the expression defining a capacitance Cx of said variable capacitor is expressible as $(Cx-Cr)/Co \cong (f1-f2)/(f1+f2)$.

14. The capacitance measurement system of claim 11 wherein said A-to-D converter is operative to perform, at the common node, three voltage measurements f1, f2, f3 and to provide, at the output, digital representations of the three voltage measurements f1, f2, f3.

15. The capacitance measurement system of claim 14 wherein said processing unit is operative to generate, using the digital representations of the three voltage measurements f1, f2, f3 the representation of the expression defining a capacitance Cx of said variable capacitor, and wherein the expression defining a capacitance Cx of said variable capacitor is expressible as $(Cx-Cr)/Co \cong (f1-f2)/(f2+(2^N-1)-f3)$, wherein "N" is equal to the number of A-to-D converter bits.

16. The capacitance measurement system of claim 9 wherein said at least one switched reference capacitor comprises a single switched reference capacitor having a capacitance Cr.

17. The capacitance measurement system of claim 16 wherein said A-to-D converter is operative to perform, at the common node, three voltage measurements f1, f2, f3, and to provide, at the output, digital representations of the three voltage measurements f1, f2, f3.

18. The capacitance measurement system of claim 17 wherein said processing unit is operative to generate, using the digital representations of the three voltage measurements f1, f2, f3, the representation of the expression defining a capacitance Cx of said variable capacitor, and wherein the expression defining a capacitance Cx of said variable capacitor is expressible as $Cr/Cx \cong ((2^N-1)+f2-f3)/((2^N-1)+2*f1-f2-f3)$, wherein N is equal to the number of A-to-D converter bits.

19. The capacitance measurement system of claim 16 wherein said A-to-D converter is operative to perform, at the common node, four voltage measurements f1, f2, f3, f4, and to provide, at the output, digital representations of the four voltage measurements f1, f2, f3, f4.

20. The capacitance measurement system of claim 19 wherein said processing unit is operative to generate, using the digital representations of the four voltage measurements f1, f2, f3, f4, the representation of the expression defining a capacitance Cx of said variable capacitor, and wherein the expression defining a capacitance Cx of said variable capacitor is expressible as $(Cx-Cr)/Cr \cong ((2^N-1)+f1-f3)/((2^N-1)+f2-f4)$, wherein N is equal to the number of A-to-D converter bits.

* * * * *